(12) United States Patent
Tabatowski-Bush et al.

(10) Patent No.: US 11,104,242 B2
(45) Date of Patent: Aug. 31, 2021

(54) BUS BAR RESISTANCE IDENTIFICATION VIA AC SIGNAL INJECTION AND BATTERY CONTROL THEREFROM

(71) Applicant: Ford Global Technologies, LLC, Dearborn, MI (US)

(72) Inventors: Benjamin A. Tabatowski-Bush, Ann Arbor, MI (US); Baojin Wang, Ypsilanti, MI (US); John Paul Gibeau, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 147 days.

(21) Appl. No.: 16/590,159

(22) Filed: Oct. 1, 2019

(65) Prior Publication Data

US 2021/0094434 A1 Apr. 1, 2021

(51) Int. Cl.
*B60L 53/62* (2019.01)
*H02J 7/00* (2006.01)
(Continued)

(52) U.S. Cl.
CPC .......... *B60L 53/62* (2019.02); *B60L 50/64* (2019.02); *H01M 10/441* (2013.01);
(Continued)

(58) Field of Classification Search
CPC ...... B60L 53/62; B60L 50/64; H01M 50/502; H01M 10/441; H01M 10/46;
(Continued)

(56) References Cited

U.S. PATENT DOCUMENTS 4,743,855 A * 5/1988 Randin ............... G01R 31/389
324/430
6,002,238 A * 12/1999 Champlin ............ G01R 31/389
320/134
(Continued)

FOREIGN PATENT DOCUMENTS

EP 3316348 B1 5/2018
WO WO-2020142398 A1 * 7/2020 .......... H01M 10/425

OTHER PUBLICATIONS

Chingchi Chen and Xingyi Xu, Modeling the Conducted EMI Emission of an Electric Vehicle (EV) Traction Drive, Jan. 1, 1998,IEEE Xplore, 1998 IEEE EMC Symposium International Symposium on Electromagnetic Compatibility pp. 796-801 (Year: 1998).*

(Continued)

*Primary Examiner* — M Baye Diao
(74) *Attorney, Agent, or Firm* — David B. Kelley; Brooks Kushman P.C.

(57) ABSTRACT

A vehicle battery system has a battery including a plurality of series connected cells, a bus bar electrically connected between an adjacent pair of the series connected cells, and circuitry. The circuitry injects a sinusoidal current waveform through the bus bar, obtains a magnitude of a sinusoidal voltage waveform contained by an overall voltage of the bus bar that is caused by the sinusoidal current waveform from a sampled and filtered version of the overall voltage and digital data defining the sinusoidal current waveform, obtains a resistance of the bus bar from the magnitude of the sinusoidal voltage waveform and a measured magnitude of the sinusoidal current waveform, and obtains a magnitude of current through the battery from a DC portion of a spectrum of the overall voltage and the resistance of the bus bar.

17 Claims, 2 Drawing Sheets

(51) Int. Cl.
*B60L 50/64* (2019.01)
*H01M 10/44* (2006.01)
*H01M 10/46* (2006.01)
*H01M 50/502* (2021.01)

(52) U.S. Cl.
CPC ......... *H01M 10/46* (2013.01); *H01M 50/502* (2021.01); *H02J 7/0013* (2013.01); *B60Y 2200/91* (2013.01); *B60Y 2300/91* (2013.01); *B60Y 2400/112* (2013.01); *H01M 2220/20* (2013.01)

(58) Field of Classification Search
CPC .............. H01M 2220/20; H02J 7/0013; B60Y 2200/91; B60Y 2400/112; B60Y 2300/91
USPC ......................................................... 320/109
See application file for complete search history.

(56) References Cited

U.S. PATENT DOCUMENTS

| | | | | |
|---|---|---|---|---|
| 8,378,688 | B2 * | 2/2013 | Ohkura | G01R 31/396 324/430 |
| 9,024,572 | B2 | 5/2015 | Nishihara et al. | |
| 9,184,652 | B2 * | 11/2015 | Acker | H02M 7/04 |
| 9,837,887 | B1 * | 12/2017 | Zhou | H03K 17/168 |
| 10,507,734 | B2 * | 12/2019 | Oguma | G01R 31/389 |
| 10,775,442 | B2 * | 9/2020 | Schlasza | G01R 31/3842 |
| 2014/0063873 | A1 * | 3/2014 | Acker | H02M 1/12 363/40 |
| 2014/0218042 | A1 * | 8/2014 | Koba | G01R 31/392 324/430 |
| 2016/0061907 | A1 * | 3/2016 | Koba | G01R 31/52 324/430 |
| 2016/0105042 | A1 * | 4/2016 | Taylor | H02J 7/0021 320/134 |
| 2016/0131719 | A1 * | 5/2016 | Takahashi | G01R 31/392 324/430 |
| 2019/0154764 | A1 * | 5/2019 | Schlasza | G01R 31/392 |

OTHER PUBLICATIONS

Silvio Ziegler et al., "Current Sensing Techniques: A Review", IEEE Sensors Journal, May 2009, 23 pgs.

* cited by examiner

BUS BAR RESISTANCE IDENTIFICATION VIA AC SIGNAL INJECTION AND BATTERY CONTROL THEREFROM

TECHNICAL FIELD

This disclosure relates to the control of automotive traction batteries.

BACKGROUND

An automotive vehicle may include a battery to power an electric machine arranged to propel wheels of the vehicle. Control of the battery, including charge, discharge, and cell balance operations, may depend on voltages of cells of the battery or currents through the cells of the battery.

SUMMARY

A vehicle traction battery system has a traction battery including a plurality of series connected cells, a bus bar electrically connected between an adjacent pair of the series connected cells, and circuitry. The circuitry injects a sinusoidal current waveform through the bus bar, applies a gain to an overall voltage of the bus bar caused by the sinusoidal current waveform to generate an amplified overall voltage of the bus bar, filters the amplified overall voltage of the bus bar to reject noise and preserve a sinusoidal voltage waveform contained by the amplified overall voltage of the bus bar to generate a filtered overall voltage of the bus bar, and samples the filtered overall voltage to generate a sampled filtered overall voltage. The circuitry multiplies the sampled filtered overall voltage by digital data defining the sinusoidal current waveform to compute a magnitude of the sinusoidal voltage waveform, divides the magnitude of the sinusoidal voltage waveform by a measured magnitude of the sinusoidal current waveform to compute a resistance of the bus bar, and filters the amplified overall voltage of the bus bar to reject AC portions of a spectrum of the amplified overall voltage greater than a predefined frequency and preserve a DC portion of the spectrum. The circuitry also divides the DC portion of the spectrum by the resistance of the bus bar to compute a magnitude of current through the traction battery, samples the magnitude of current through the traction battery to identify an instantaneous magnitude of current through the traction battery, and charges the traction battery according to the instantaneous magnitude.

A method for controlling a vehicle traction battery system includes injecting a sinusoidal current waveform through a bus bar electrically connected between an adjacent pair of series connected cells of a traction battery, applying a gain to an overall voltage of the bus bar caused by the sinusoidal current waveform to generate an amplified overall voltage of the bus bar, filtering the amplified overall voltage of the bus bar to reject noise and preserve a sinusoidal voltage waveform contained by the amplified overall voltage of the bus bar to generate a filtered overall voltage of the bus bar, and sampling the filtered overall voltage to generate a sampled filtered overall voltage. The method also includes multiplying the sampled filtered overall voltage by digital data defining the sinusoidal current waveform to compute a magnitude of the sinusoidal voltage waveform, dividing the magnitude of the sinusoidal voltage waveform by a measured magnitude of the sinusoidal current waveform to compute a resistance of the bus bar, and filtering the amplified overall voltage of the bus bar to reject AC portions of a spectrum of the amplified overall voltage greater than a predefined frequency and preserve a DC portion of the spectrum. The method further includes dividing the DC portion of the spectrum by the resistance of the bus bar to calculate a magnitude of current through the traction battery, and sampling the magnitude of current through the traction battery to identify an instantaneous magnitude of current through the traction battery.

A vehicle traction battery system has a traction battery including a plurality of series connected cells, a bus bar electrically connected between an adjacent pair of the series connected cells, and circuitry. The circuitry injects a sinusoidal current waveform through the bus bar, obtains a magnitude of a sinusoidal voltage waveform contained by an overall voltage of the bus bar that is caused by the sinusoidal current waveform from a sampled and filtered version of the overall voltage and digital data defining the sinusoidal current waveform, and obtains a resistance of the bus bar from the magnitude of the sinusoidal voltage waveform and a measured magnitude of the sinusoidal current waveform. The circuitry also obtains a magnitude of current through the traction battery from a DC portion of a spectrum of the overall voltage and the resistance of the bus bar.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Due to the nature of bus bars, which are usually made of copper or aluminum, they appear as resistors. Thus, there will be voltage drops across bus bars during normal operation. If bus bars can be used as current shunts, money normally spent on current shunts can be saved. It may be difficult, however, to directly use the voltage drop across a bus bar to estimate an instantaneous pack current accurately. This is because aluminum and copper are subject to temperature drift, the bus bar may experience a temperature gradient, and it may be difficult to make bus bars identical. For these reasons, it is difficult to perform temperature compensation on bus bar related measurements.

Here, solutions are proposed to effectively measure bus bar resistance first, and then measure the associated voltage.

As a result, pack current can be calculated. As discussed in more detail below, AC current injection can be used to measure bus bar resistance.

In this document, the term "shunt" refers to a bus bar element that can be found in a battery pack connecting cells together and carrying the pack current. Such a bus bar element has a pair of voltage taps that allow measurement of the voltage across a short segment of bus bar. It also has a small Ohmic resistance—less than 5 mΩ for example. By this measurement of the voltage developed across the resistance of a bus bar, the bus bar is being used as a shunt in that an Ohmic resistance indicative of current is obtained via measurement of voltage across it.

Figure 1:
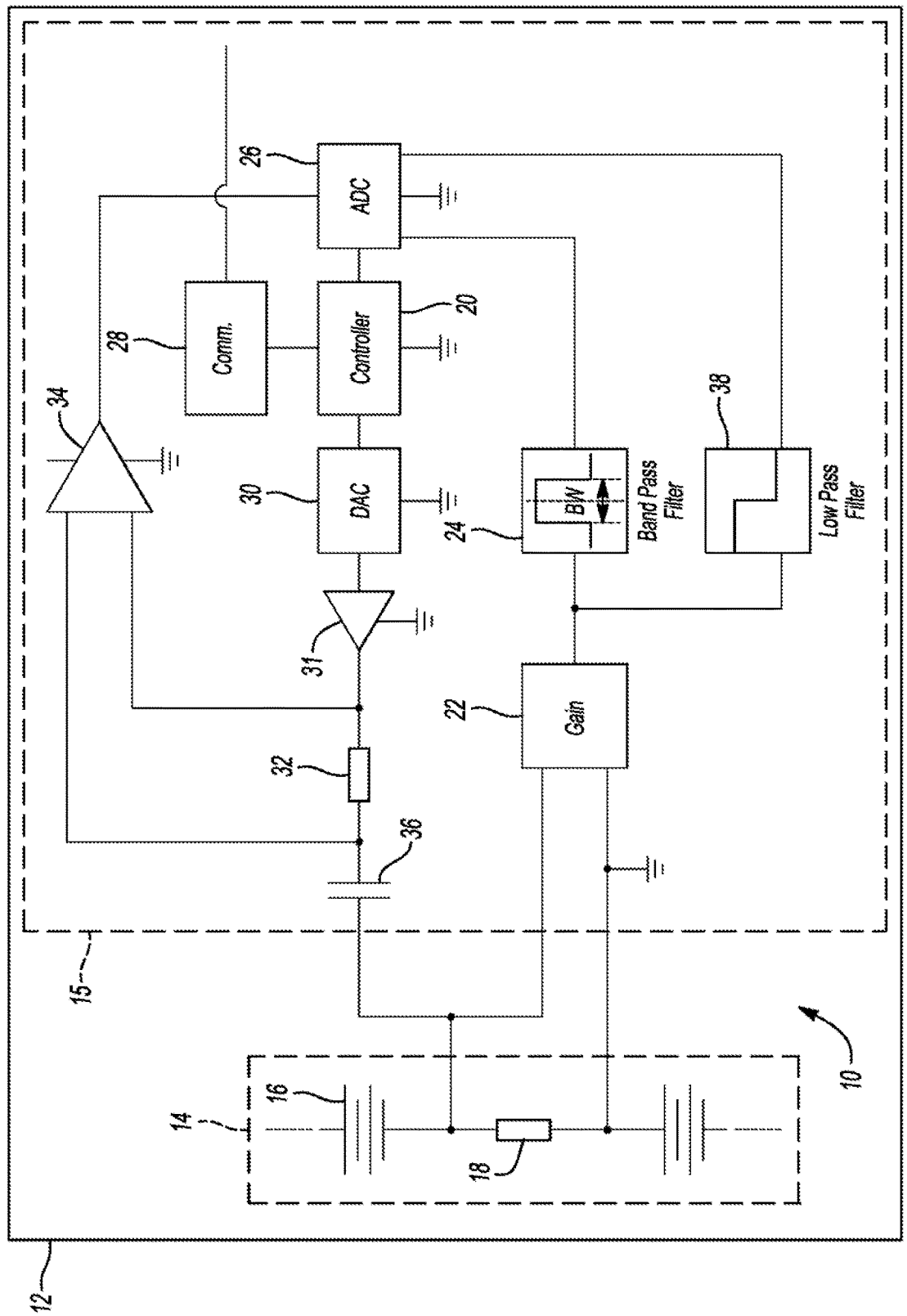
FIG. 1 is a schematic diagram of a battery back and corresponding control circuitry.

Referring to FIG. 1, a traction battery system 10 for a vehicle 12 includes a battery pack 14 and circuitry 15. The battery pack 14 has a number of series connected cells 16 and a bus bar 18 between an adjacent pair of the cells 16. Being between an adjacent pair of the cells 16 can also mean being between one of the cells 16 and other electrical components such as contactors, fuses, or other bus bars, etc.

The circuitry 15 includes microcontroller 20, differential amplifier 22, band pass filter 24, analog-to-digital converter (ADC) 26, communication module 28, digital-to-analog converter (DAC) 30, buffer 31, measurement resistance 32, differential amplifier 34, capacitor 36, and low pass filter 38.

The microcontroller 20 receives signals, processes data, stores data, and performs communication and control, etc.

The differential amplifier 22 has a gain, MEAS_GAIN, followed by the band pass filter 24 to measure the voltage across the bus bar 18. Output of the band pass filter 24 is supplied to the ADC 26 and then to the microcontroller 20. The band pass filter 24 has a center frequency, F_MEAS, and a bandwidth, BW_MEAS. The signal at the output of the band pass filter 24 is referred to as SHNTSIG_BPSS_FILT_AMP.

The communication module 28 sends/receives messages via isolated coupling or a non-isolated path between the microcontroller 20 and any other controller/communication bus of the vehicle 12, e.g., controller area network, etc.

The DAC 30 is controlled by the microcontroller 20. The microcontroller 20 sends out digital data defining a sinusoidal voltage waveform and the DAC 30 will convert the digital data to an analog sinusoidal voltage waveform. Then, the buffer 31 will couple the signal to apply an external load to inject a sinusoidal current waveform through the bus bar 18. The measurement resistance 32 measures the AC current. The differential amplifier 34 measures the current through the measurement resistance 32. The microcontroller 20 reads the current from the ADC 26 for closed-loop AC current control. The capacitor 36 prevents DC current from flowing to the bus bar 18.

The microcontroller 20, DAC 30, buffer 31, measurement resistance 32, amplifier 34, and ADC 26 form a current control loop. By measuring the feedback from the measurement resistance 32, the microcontroller 20 is able to generate an accurate known AC current waveform through the bus bar 18. This AC current will be at frequency F_MEAS.

The voltage measured across the bus bar 18 by the amplifier 22 and ADC 26 includes both AC voltage and DC voltage. The AC voltage is injected by the above-mentioned AC current control loop. The DC voltage is introduced by high-voltage battery operating current. The high-voltage battery operating current does have some small frequency content; up to a maximum frequency of Max_InfoFreqPresent. For example, Max_InfoFreqPresent may be 50 Hz, while for example, F_MEAS may be 1 Mhz. So, the pack current information measured is referred to as a DC voltage, understanding that it does have some low frequency content; but the signal is very slowly changing—almost a DC signal. In this document, the "DC voltage" or "DC signal" refers to this low frequency signal related to the pack current, and the "AC signal" refers to the injected AC current that flows through the capacitance 36.

The microcontroller 20 receives the DC and AC signals measured by the ADC 26. The DC signal is denoted as V_b_dc, and the AC signal is denoted as V_b_ac. By comparing the known AC current injected and the measured AC signal V_b_ac, the resistance of the bus bar 18 can be obtained, which can be denoted as R_b. As a consequence, the pack current of the battery pack 14 can be calculated by the controller 20 (or another controller) by using V_b_dc/R_b.

Conventional techniques may inject a small current into a shunting element, observe the generated voltage, and compute the resistance. The proposed technique, however, applies a sinusoidal AC current at frequency F_MEAS. The resistance of the bus bar 18 is very low, e.g., 1 mΩ, and the injected current is quite low, e.g., 5 mA peak-to-peak sinusoid. In particular, the magnitude of the DAC buffer output 31 is adjusted in order to attain a 5 mA peak-to-peak sinusoid, for example. Therefore, the voltage signal generated is quite low, e.g., 5 µV peak-to-peak. Now, the analog-to-digital (A/D) version of SHNTSIG_BPSS_FILT_AMP can be taken. Note that this signal is the small voltage from the bus bar 18, which is band pass filtered with a center at F_MEAS. The bandwidth of this filter is relatively small, for example 1% of the frequency F_MEAS. The order of the band pass filter (the number of poles and zeros) needs to be selected appropriately in order to obtain this narrow bandwidth, which is helpful for filtering out extraneous noise that would otherwise cause problems in successive steps. Since this test frequency is also generated in the DAC 30, there is precise control in the generation of this signal. MEAS_GAIN is such that the worst case signal received will fill the full span of the A/D input, which means that the peak value of the signal reaches precisely 4095 counts for a 12 bit A/D. It can be presumed that the ADC 26 is bipolar, ±2.5V, with 4095 counts corresponding to +2.5V in and 0 counts corresponding to −2.5V in. 0V in corresponds to half scale or 2048 counts. This approach will yield good signal to noise ratio for the following step. Now, the signal SHNTSIG_BPSS_FILT_AMP that fits into the full scale range of the A/D converter is taken. The next step is to multiply this signal by the exact sinusoid at the output of the DAC 30. Loosely, this is a down conversion to zero frequency (also known as direct conversion). This step is performed in the digital domain.

$$\text{CONVERTED\_BBSIG} = (\text{SHNTSIG\_BPSS\_FILT\_AMP}\_A2D-(A2/2))* (A2*(½)*\sin(\omega t)) \quad \text{EQUATION 1}$$

Here, $\omega = 2\pi*\text{Fmeas}$, and A2 is 4095 counts for a 12 bit A/D.

The idea is to capacitively couple a small sinusoidal AC signal into a low-resistance bus bar, using closed-loop control, to get a specific magnitude of injected AC current. This small AC sinusoidal current is at a relatively high frequency, for example 1 Mhz. This AC current generates a small sinusoidal AC voltage across an inexpensive bus bar. The novel technique of amplifying this small AC voltage through the gain block 22 and band pass filtering through the band pass filter 24 is then applied. The band pass filtering is helpful as F_MEAS is purposely selected to be a frequency at which not much noise is expected in the application. Then, the band pass filter is effective at improving the signal to noise ratio for the AC voltage at the output of the band pass filter 24.

To accurately measure this signal, the novel technique of down conversion is applied. When the A/converted output of the band pass filter 24, SHNTSIG_BPSS_FILT_AMP_A2D, shifted down by A2/2 counts, is multiplied by (A2/2)*Sin (ωt), this actually performs a direct conversion down to baseband and permits an accurate measurement of the magnitude of the sinusoidal signal. In Equation 1, CONVERTED_BBSIG is now proportional to the resistance of the bus bar 18. In further detail, SHNTSIG_BPSS_FILT_AMP_A2D is equal to $R\_b*I$max*Meas_Gain*BPPassFraction*MaxCts*(1/$V$max)*(½)Sin(ω$t$)+($A2$/2), and CONVERTED_BBSIG= (SHNTSIG_BPSS_FILT_AMP_$A2D$−($A2$/2))* ($A2$*(½)*Sin(ω$t$).

Simplifying, $K1=R\_b*I$max*Meas_Gain_BPPassFraction*MaxCts* (1/$V$max)*(½)

$A=B$ω$t$ $K1*$Sin $A*$Sin $B=$½$K1$(Cos($A-B$)−Cos($A+B$))

$K1*$Sin $A*$Sin $B=$½$K1$(Cos 0−Cos(2ω$t$))

$K1*$Sin $A*$Sin $B=$½$K1$(1−Cos(2ω$t$))

$K1*$Sin $A*$Sin $B==$½$K1-=K1$ Cos(2ω$t$)

The output of the multiplication step above provides 2 terms, a DC term at ½ K1, and an AC term at ½ K1 Cos(2 ωt). By simple low-pass filtering, the ½ K1 Cos(2 ωt) term can be removed, for example, by implementing a digital lowpass filter with corner frequency at Fmeas. Notice the term being filtered out is 2*Fmeas, so this should be effective. The DC term is ½ K1, which is how many counts are measured; this can be referred to as MeasCts. That is, MeasCts=½$K1$ $K1=R\_b*I$max*Meas_Gain*BPPassFraction*MaxCts* ($I/V$max)*½

R_b is the resistance of the busbar.

$I$max=2.5 mA

ω=2π*$F$_MEAS

MaxCts=4095 for a bipolar 12-bit A/D converter
Meas_Gain is set via closed loop control to set the peak counts of SHNTSIG_BPSS_FILT_AMP_A2D at MaxCts.
BPPassFraction=Vout/Vin of the bandpass filter at Fmeas, which provides a measure of the insertion loss.

$V$max=2.5V

Now,

MeasCts=½*$R\_b*I$max*Meas_Gain*BPPassFraction*MaxCts* (1/$V$max)*½

MeasCts=¼*$R\_b*I$max*Meas_Gain*BPPassFraction*MaxCts* (1/$V$max)

MeasCts=¼*$R\_b$*0.0025*Meas_gain_BPPassFraction*4095* (1/2.5)

MeasCts=$R\_b$*Meas_gain*BPPassFraction*1.024

So, $R\_b$=MeasCts/(Meas_gain*BPPassFraction*1.024)

$R\_b$=MeasCts/(Meas_gain*BPPassFraction*1.024)   EQUATION 2

Then, the output of low pass filter 38 is measured. This filter has a corner frequency many decades below F_MEAS, so the signal coming out of the low pass filter 38 has any signal at F_MEAS completely removed. Also, it needs to provide normal analog filtering that is performed on a current sensor signal, for example a corner frequency of 50 Hz. The output of the low pass filter 38 is called SHNTSIG_LPSS_FILT_AMP. Then, the A/D converted output of the low pass filter 38 is proportional to the pack current through the battery pack 14.

PACK_CURRENT=$A2D$_SHNTSIG_LPSS_FILT_AMP/ BUSBAR_RESISTANCE   EQUATION 3

The above comes from Ohm's law I=V/R, where I is the pack current to be measured, R is the measured resistance of the bus bar 18, and V is the A/D converted low pass filtered voltage across the bus bar 18. PACK_CURRENT can then be used by the controller 20 (or another controller) during charging and discharging of the battery pack 14. If PACK_CURRENT remains below a threshold value for a predetermined time for example, the controller 20 may initiate charging of the battery pack 14, etc. PACK_CURRENT can also be used by the controller 20 (or other controllers) for different applications such as battery power limit calculation, state of charge estimation, etc.

Thus, these circuit details use an inexpensive existing bus bar to measure its resistance, and then also amplifies and measures the small DC signal across the bus bar 18, which is proportional to the instantaneous current of the battery pack 14 desired. This approach has a significant cost advantage over shunt current sensor approaches, since precision shunts are costly. Here, the shunt is a bus bar that is already in the battery pack 14.

Figure 2:
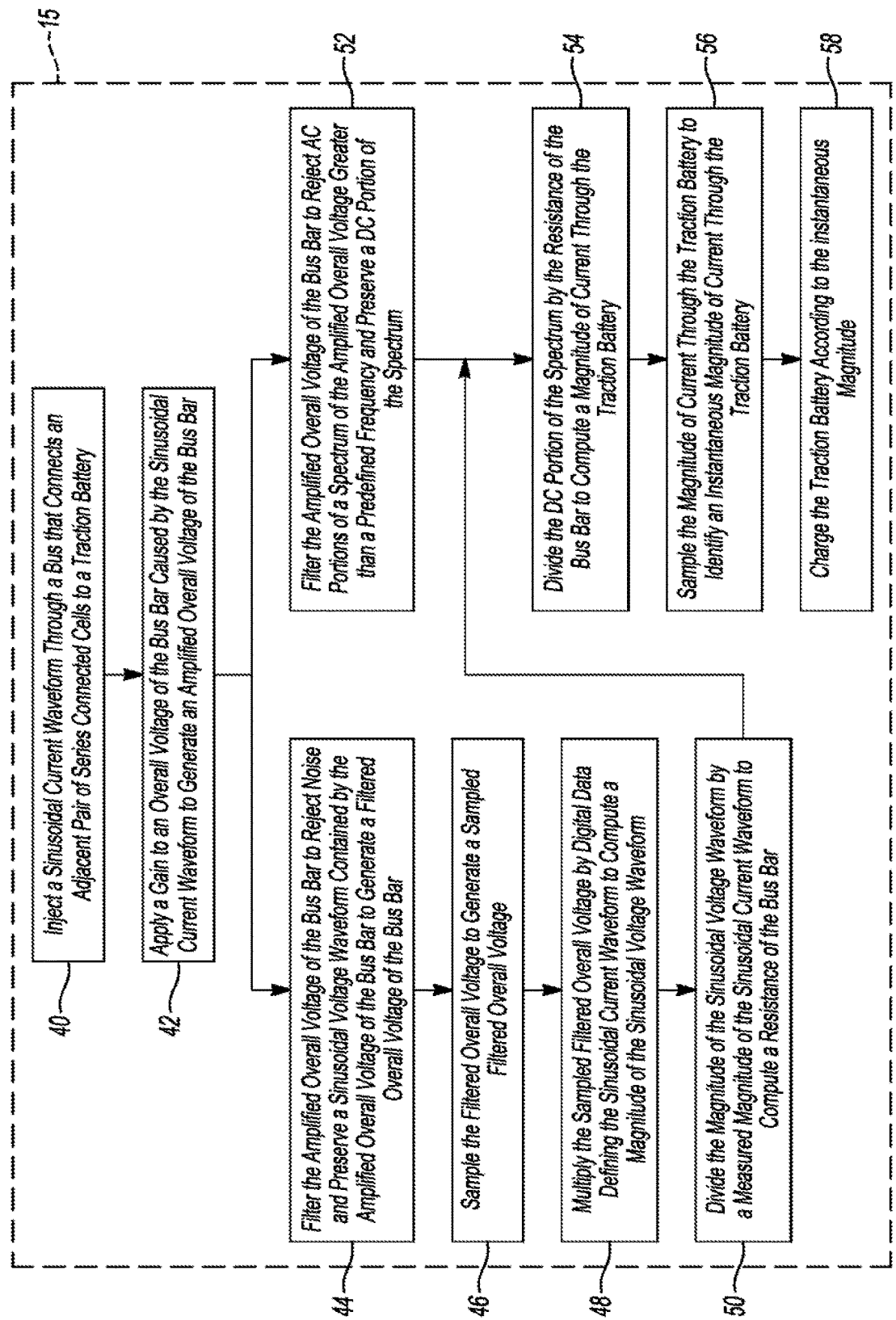
FIG. 2 is a flow chart of an algorithm for controlling a vehicle traction battery system.

With reference to FIG. 2, at operation 40 a sinusoidal current waveform is injected through the bus bar. At operation 42, a gain is applied to an overall voltage of the bus bar caused by the sinusoidal current waveform to generate an amplified overall voltage of the bus bar. The amplified overall voltage of the bus bar is filtered at operation 44 to reject noise and preserve a sinusoidal voltage waveform contained by the amplified overall voltage of the bus bar to generate a filtered overall voltage of the bus bar. The filtered overall voltage is sampled at operation 46 to generate a sampled filtered overall voltage. At operation 48, the sampled filtered overall voltage is multiplied by digital data defining the sinusoidal current waveform to compute a magnitude of the sinusoidal voltage waveform. At operation 50, the magnitude of the sinusoidal voltage waveform is divided by a measured magnitude of the sinusoidal current waveform to compute a resistance of the bus bar. The amplified overall voltage of the bus bar is filtered at operation 52 to reject AC portions of a spectrum of the amplified overall voltage greater than a predefined frequency and preserve a DC portion of the spectrum. The DC portion of the spectrum is divided by the resistance of the bus bar at operation 54 to compute a magnitude of current through the traction battery. At operation 56, the magnitude of current through the traction battery is sampled to identify an instantaneous magnitude of current through the traction battery. And at operation 58, the traction battery is charged according to the instantaneous magnitude. The instantaneous magnitude may also be provided to any applications that need pack current data, including but not limited to battery state of charge estimation, battery power limit calculation, charging/discharging control, etc. The instantaneous magnitude may be used, for example, to compute battery power limits using known techniques. The operation of the battery may then be controlled so that the established power limits are not violated. The operations of FIG. 2 may be performed periodically during a drive cycle or as needed.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as Read Only Memory (ROM) devices and information alterably stored on writeable storage media such as floppy disks, magnetic tapes, Compact Discs (CDs), Random Access Memory (RAM) devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle traction battery system comprising:
    a traction battery including a plurality of series connected cells;
    a bus bar electrically connected between an adjacent pair of the series connected cells; and
    circuitry configured to
        inject a sinusoidal current waveform through the bus bar,
        apply again to an overall voltage of the bus bar caused by the sinusoidal current waveform to generate an amplified overall voltage of the bus bar,
        filter the amplified overall voltage of the bus bar to reject noise and preserve a sinusoidal voltage waveform contained by the amplified overall voltage of the bus bar to generate a filtered overall voltage of the bus bar,
        sample the filtered overall voltage to generate a sampled filtered overall voltage,
        multiply the sampled filtered overall voltage by digital data defining the sinusoidal current waveform to compute a magnitude of the sinusoidal voltage waveform,
        divide the magnitude of the sinusoidal voltage waveform by a measured magnitude of the sinusoidal current waveform to compute a resistance of the bus bar,
        filter the amplified overall voltage of the bus bar to reject AC portions of a spectrum of the amplified overall voltage greater than a predefined frequency and preserve a DC portion of the spectrum,
        divide the DC portion of the spectrum by the resistance of the bus bar to compute a magnitude of current through the traction battery,
        sample the magnitude of current through the traction battery to identify an instantaneous magnitude of current through the traction battery, and
        charge the traction battery according to the instantaneous magnitude.

2. The system of claim 1, wherein the circuitry include a bandpass filter to perform the filtering of the amplified overall voltage.

3. The system of claim 2, wherein a center frequency of the bandpass filter is defined by a frequency of the sinusoidal current waveform.

4. The system of claim 1, wherein the circuitry includes a lowpass filter to perform the filtering of the amplified overall voltage.

5. The system of claim 4, wherein the predefined frequency is defined by a corner frequency of the low pass filter.

6. The system of claim 1, wherein a magnitude of the sinusoidal current waveform has a magnitude less than 50 milliamps.

7. The system of claim 1, wherein a resistance of the bus bar is less than 5 milliohms.

8. A method for controlling a vehicle traction battery system comprising:
    injecting a sinusoidal current waveform through a bus bar electrically connected between an adjacent pair of series connected cells of a traction battery;
    applying a gain to an overall voltage of the bus bar caused by the sinusoidal current waveform to generate an amplified overall voltage of the bus bar,
    filtering the amplified overall voltage of the bus bar to reject noise and preserve a sinusoidal voltage waveform contained by the amplified overall voltage of the bus bar to generate a filtered overall voltage of the bus bar,
    sampling the filtered overall voltage to generate a sampled filtered overall voltage;
    multiplying the sampled filtered overall voltage by digital data defining the sinusoidal current waveform to compute a magnitude of the sinusoidal voltage waveform;
    dividing the magnitude of the sinusoidal voltage waveform by a measured magnitude of the sinusoidal current waveform to compute a resistance of the bus bar;
    filtering the amplified overall voltage of the bus bar to reject AC portions of a spectrum of the amplified overall voltage greater than a predefined frequency and preserve a DC portion of the spectrum;

dividing the DC portion of the spectrum by the resistance of the bus bar to calculate a magnitude of current through the traction battery, and sampling the magnitude of current through the traction battery to identify an instantaneous magnitude of current through the traction battery.

9. The method of claim 8, wherein the filtering of the amplified overall voltage is performed by a band pass filter.

10. The method of claim 9, wherein a center frequency of the bandpass filter is defined by a frequency of the sinusoidal current waveform.

11. The method of claim 8, wherein the filtering of the amplified overall voltage is performed by a low pass filter.

12. The method of claim 11, wherein the predefined frequency is defined by a corner frequency of the low pass filter.

13. The method of claim 8, wherein a magnitude of the sinusoidal current waveform has a magnitude less than 50 milliamps.

14. The method of claim 8, wherein a resistance of the bus bar is less than 5 milliohms.

15. A vehicle traction battery system comprising:
a traction battery including a plurality of series connected cells;
a bus bar electrically connected between an adjacent pair of the series connected cells; and
circuitry configured to
inject a sinusoidal current waveform through the bus bar,
obtain a magnitude of a sinusoidal voltage waveform contained by an overall voltage of the bus bar that is caused by the sinusoidal current waveform from a sampled and filtered version of the overall voltage and digital data defining the sinusoidal current waveform,
obtain a resistance of the bus bar from the magnitude of the sinusoidal voltage waveform and a measured magnitude of the sinusoidal current waveform, and
obtain a magnitude of current through the traction battery from a DC portion of a spectrum of the overall voltage and the resistance of the bus bar.

16. A vehicle traction battery system of claim 15, wherein the circuitry is further configured to apply again to the overall voltage.

17. A vehicle traction battery system of claim 15, wherein the circuitry is further configured to filter the overall voltage of the bus bar to reject noise and preserve the sinusoidal voltage waveform contained by the overall voltage of the bus bar.

* * * * *